United States Patent
Hazen et al.

[11] Patent Number: 6,088,264
[45] Date of Patent: *Jul. 11, 2000

[54] FLASH MEMORY PARTITIONING FOR READ-WHILE-WRITE OPERATION

[75] Inventors: Peter K. Hazen, Auburn; Ranjeet Alexis, Folsom; Robert E. Larsen, Shingle Springs; Charles W. Brown; Sanjay Talreja, both of Folsom, all of Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/002,649

[22] Filed: Jan. 5, 1998

[51] Int. Cl.$^7$ .................................................. G11C 16/04
[52] U.S. Cl. .............................. 365/185.11; 365/185.29; 365/185.33
[58] Field of Search .......................... 365/185.11, 185.33, 365/185.29, 189.04, 189.09, 230.03

[56] References Cited

U.S. PATENT DOCUMENTS

| | | | |
|---|---|---|---|
| 5,245,572 | 9/1993 | Kosonocky et al. | 365/189.02 |
| 5,361,227 | 11/1994 | Tanaka et al. | 365/189.01 |
| 5,361,343 | 11/1994 | Kosonocky et al. | 395/425 |
| 5,426,603 | 6/1995 | Nakamura et al. | 365/149 |
| 5,483,486 | 1/1996 | Javanifard et al. | 365/185.17 |
| 5,572,466 | 11/1996 | Sukegawa | 365/185.33 |
| 5,590,074 | 12/1996 | Akaogi et al. | 365/185.22 |
| 5,625,595 | 4/1997 | Ikeda | 365/194 |
| 5,648,929 | 7/1997 | Miyamoto | 365/185.04 |
| 5,732,030 | 3/1998 | Dorney | 365/200 |
| 5,748,528 | 5/1998 | Campardo et al. | 365/185.13 |
| 5,751,634 | 5/1998 | Itoh | 365/185.17 |
| 5,796,657 | 8/1998 | Lee | 365/185.11 |
| 5,867,430 | 2/1999 | Chen et al. | 365/189.04 |
| 5,917,744 | 6/1999 | Kirihata et al. | 365/63 |
| 5,936,884 | 8/1999 | Hasbun et al. | 365/185.03 |
| 5,949,713 | 9/1999 | Bedarida et al. | 365/185.11 |

OTHER PUBLICATIONS

Sharp Press Release, "Sharp Electronics Corporation Announces Unique Dual–Task 4 Mbit Flash Memory", pp. 1–2, Aug. 1, 1996.

Mitsubishi Press Release, Mitsubishi Announces Background Operation Feature in High Density, 8–Mbit Dinor Mobile Flash Memory, pp. 1–3, May 19, 1997.

Sharp Corporation, "Flash Memory LH28F800SUTD", Version 1 (Preliminary), pp. 1–37, Dec. 9, 1996.

International Search Report, PCT/US98/25217, dated Apr. 15, 1999, 5 pgs.

*Primary Examiner*—Son Mai
*Attorney, Agent, or Firm*—Blakely, Sokoloff, Taylor & Zafman LLP

[57] ABSTRACT

A method and apparatus for partitioning a flash memory device is provided. The flash memory device includes a plurality of partitions, each partition able to be read, written, or erased simultaneously with the other partitions.

23 Claims, 4 Drawing Sheets ions on a single flash memory device. It is a further intended advantage of the present invention to permit updating of code stored on a flash memory device while code is being executed.

FLASH MEMORY PARTITIONING FOR READ-WHILE-WRITE OPERATION

FIELD OF THE INVENTION

The present invention relates to flash memory, and more specifically, to partitioning of flash memory.

BACKGROUND

Flash memory devices are special type of EEPROM that can be erased and written to in blocks instead of one byte at a time. Some applications of the flash memory include embedded control code and data of a cellular telephone so that it can easily be updated if necessary. Flash memory may also be used in modems because it enables the modem manufacturer to support new protocols as they become standardized. Flash memory may further be used in computers to provide a basic input/output system (BIOS) that can be upgraded. Other uses are known in the art.

FIG. 1 illustrates one prior art flash memory device 100. The memory 110 into which data is written has an X-decoder 160 and a Y-decoder 180 associated with it. The X-decoder 160 and Y-decoder 180 permit addressing the rows and columns of memory. A user interface 120 controls the flash memory device 100. The user interface 120 interfaces with a processor that controls access to the memory 110. A status register 130 stores the current status—writing, reading, or erasing—of the memory 110. The processor knows the status of the flash memory from the user interface 120.

Sense amplifiers 140 are associated with the memory 110. In one prior art implementation, the sense amplifiers are used to amplify signals for writing to and reading from the memory 110. For a row divided into sixteen input/outputs (I/Os), sixteen sense amplifiers 140 are used for writing and reading, one for each I/O. A charge pump 150 is further included in the flash memory 100. The charge pump 150 is used to provide the voltage levels needed for reading from, writing to, and erasing the memory 110. Generally, prior art flash memory devices are erased and written to as a block, consisting of a subset of memory 110. There is one set of circuitry, thus a user can not write to one block of the flash memory while simultaneously erasing or reading another block of the memory.

Simultaneous operation is desired in some applications that are constrained by the erase time (typically 250–500 ms) of a flash memory block. For example, a cellular telephone executes code directly from the flash memory. It is advantageous to be able to erase a separate memory block to reclaim space for data storage at the same time.

One prior art solution to this problem is to have multiple flash memory devices. In that case, one device may be written to, while the other device is being erased. This has numerous disadvantages. The multiple devices take up more real-estate. Because there are multiple devices hardware is duplicated. Additionally, using multiple flash memory devices may cost more, increase power use, and decrease overall system reliability.

SUMMARY OF THE INVENTION

The present invention relates to partitioning of a flash memory device to permit read-while-write operations. The flash memory device includes a plurality of partitions, each partition able to be read, written, or erased simultaneously with the other partitions.

Other features, and advantages of the present invention will be apparent from the accompanying drawings and from the detailed description that follows below.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for partitioning a flash memory for read-while-write operation is described. It is an intended advantage of the present invention to permit simultaneous reading, and/or writing and/or erasing operations on a single flash memory device. It is a further intended advantage of the present invention to permit updating of code stored on a flash memory device while code is being executed.

Figure 1:
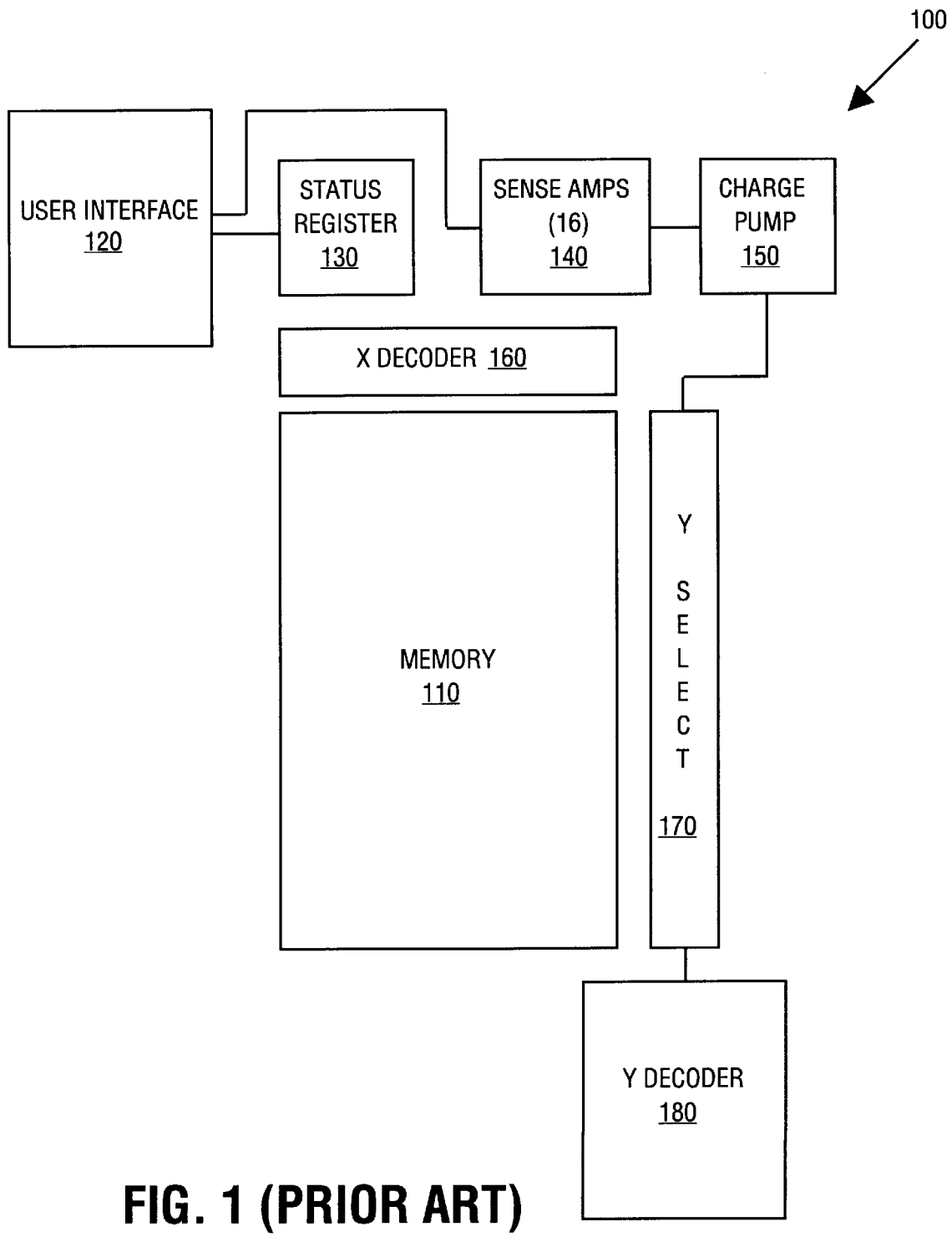
FIG. 1 illustrates a prior art flash memory device.
Figure 2:
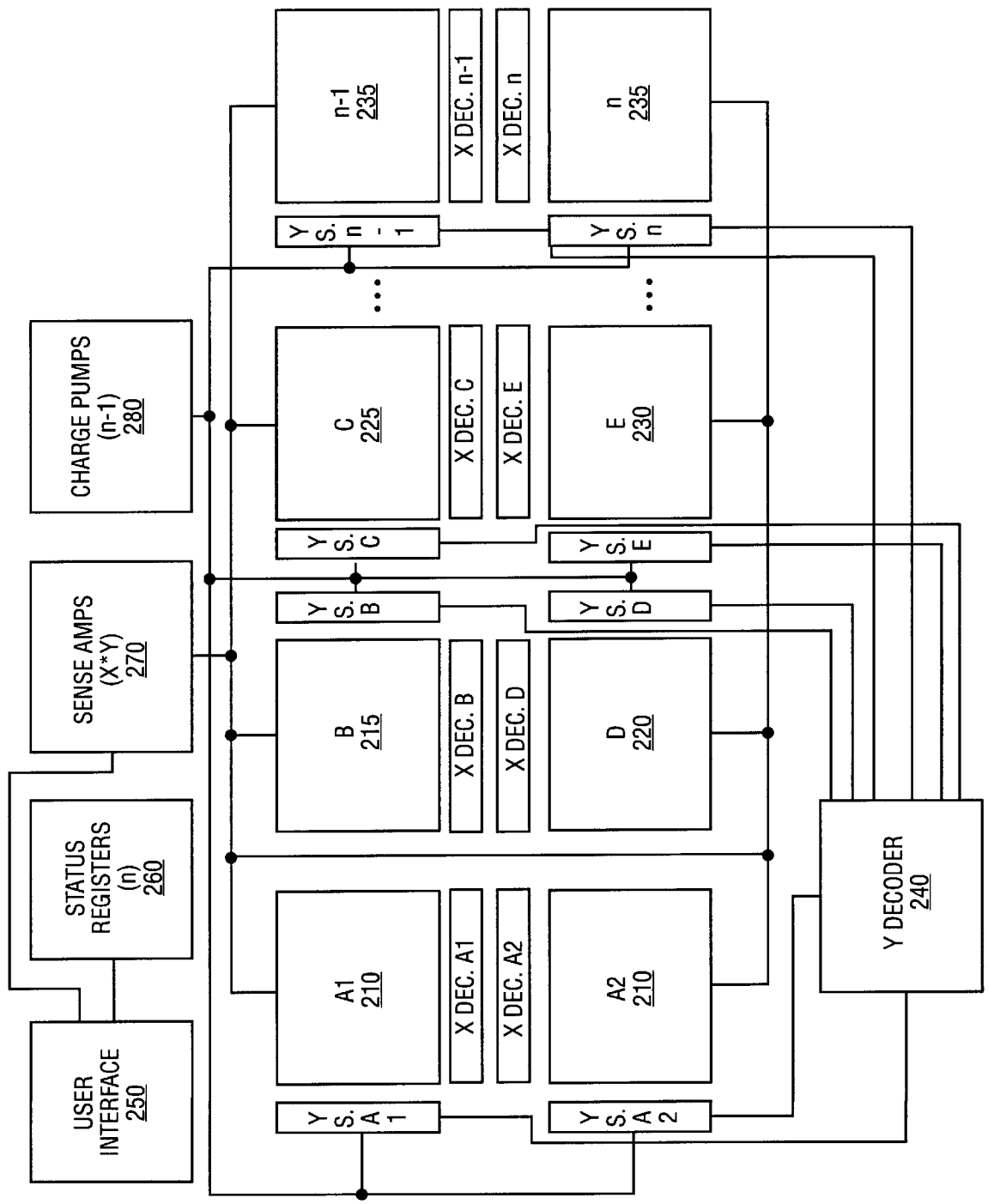
FIG. 2 illustrates one embodiment of a multi-partitioned flash memory device.

FIG. 2 illustrates a multi-partitioned flash memory device. Partitions A 210, B 215, C 225, D 220, E 230, . . . n−1 235, n 235 are illustrated. Each partition is implemented as a physically separate device on the flash memory device. For one embodiment, each partition is implemented on a different physical plane. Each of the partitions 210, 215, 220, 225, 225, 230, 235, and 240 has associated an X decoder, and a Y selector. Each of the Y selectors are coupled to a Y decoder 240, that controls the Y selectors. For an alternative embodiment, multiple Y decoders 240 may be present in the system. The X decoders and Y selectors enable selection of a specific area within flash memory 200 for access, including reading, writing, or erasing. Having multiple X selectors and Y decoders permits simultaneous access to more than one subsection of the flash memory. For example, while partition A may be erased, partition B may simultaneously be read, and partition C written to. Each of the partitions may include one or more blocks, that may be erased separately. Thus, for example, a memory in partition A may be written to, while a memory block in partition B is being erased.

A user interface 250 permits a user to control the access to the flash memory 200. For one embodiment, the user interface 250 is part of the flash memory itself. For an alternative embodiment, the user interface 250 is located on a separate chip. The interface includes a number of state machines used to control each of the write parallel operations. Thus, if there can be two parallel write operations (writing to the data block while updating the code, for example), there are two state machines. If there can be three parallel write operations, three state machines are included. These state machines are described in more detail in the concurrently filed related applications entitled "An Interface For a Read-While-write Memory", Serial No. 09/002,691, and "A Read-While-Write Memory Including fewer Verify Sense Amplifiers Than Read Sense Amplifiers", Ser. No. 09/002,645.

Status registers are coupled to the user interface 260. The status registers 260 indicate the status of each partition. There are n partitions, and for one embodiment there are n status registers 260. The status of each partition is one of the following: idle, being read, being written to, or being erased.

Sense amplifiers 270 are coupled to the user interface 250 as well. The sense amplifiers are used in the read, write, and erase operations. For one embodiment, the number of sense amplifiers 270 is determined as follows. For a sixteen bit wide flash memory, sixteen sense amplifiers 270 are needed for each parallel executable operation. Thus, for example, if a first partition is read while a second partition is written to, 32 sense amps 270 are needed. For example, if two partitions may be read in parallel, 32 sense amps 270 are needed for reading. The number of sense amplifiers 270 is a factor of the width of the output row of the flash memory (X) times the number of parallel executable operations (Y). For one embodiment, for a three partition flash memory, for example, one partition may be read, another partition written to, and a third partition erased uses 3X sense amplifiers 270. Sense amplifiers 270 used for erasing use a very low percentage of the total erase time. Similarly, sense amplifiers 270 used for writing use a low percentage of the total write time. Therefore, for one embodiment, a single sense amp 270 is used for each parallel executable write operation and each parallel executable erase operation. The sense amp 270 is used for verifying each bit as it is written.

Additionally, redundant sense amplifiers 270 may be included for other operations, such as a redundant column access. For one embodiment, for each parallel read and/or write, two redundancy sense amplifiers 270 are included in sense amplifier block 270.

Furthermore, charge pumps 280 are included in the circuit. Charge pumps 280 are used to set the voltage level for reading, writing, and erasing. For one embodiment, the voltage level used for erasing is approximately −10 volts. For one embodiment, the voltage level used for reading and writing is approximately 7 volts. For one embodiment, a single charge pump 280 that has multiple leads to permit parallel access to partitions is used. Alternatively, multiple separate charge pumps 280 may be used to provide the voltage levels needed for accessing the different partitions simultaneously. The charge pumps 280 are coupled to the Y-selectors of each of the partitions, to raise the voltage level to the appropriate level to read, write, or erase.

The multi-partitioned flash memory illustrated in FIG. 2 may be used for a number of purposes. The number of partitions depends upon the function of the flash memory. For example, a three partitioned flash memory device is illustrated in FIG. 3.

One example of using a three partitioned flash memory device is as follows. A first partition may be used to store data. A second partition may be used to store code, that is executed by an apparatus that includes the flash memory device. The third partition may be used to permit updating of the code. Thus, for example, if the code changes as a result of an update, new code is written to the third partition while the original code in the second partition is concurrently executing. When the new code has been written and verified, the third partition can become the partition used for the code. Thus, seamless updating of flash memory devices is possible. Another example of a three partitioned flash memory device is having code executed from a first partition, while updating data in a second partition. Thus, for example, if the code execution results in an updating of data, this can be accomplished seamlessly.

Figure 3:
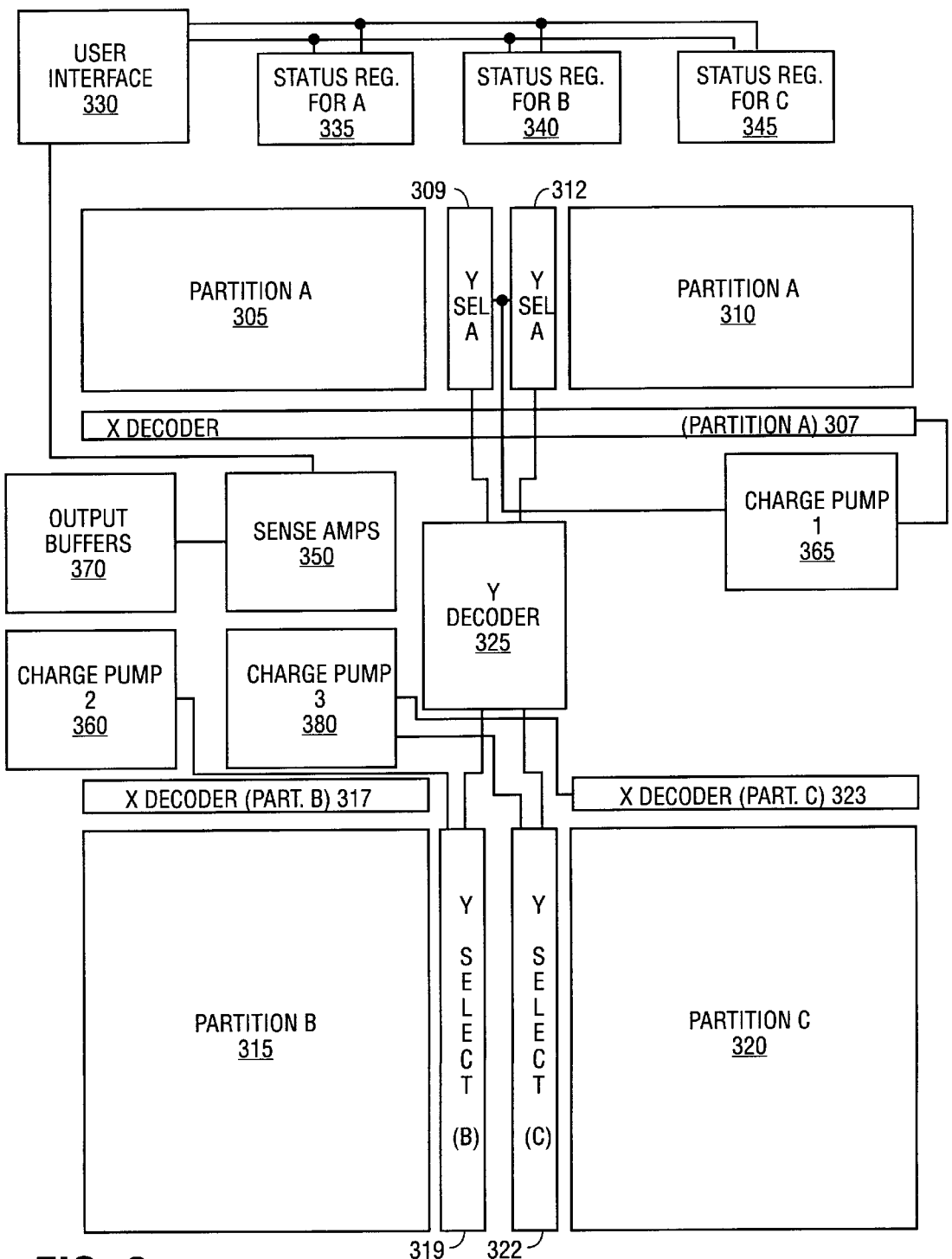
FIG. 3 illustrates one embodiment of a three partitioned flash memory device.

FIG. 3 illustrates one embodiment of a three partitioned flash memory device. Partition A 310, partition B 315, and partition C 320 each have an associated X decoder and Y select, and can be accessed separately. The layout illustrated in FIG. 3 corresponds to one embodiment of an actual layout of a flash memory device. The X decoder 307 and Y select 309 and 312 are associated with Partition A 305, 310. For one embodiment, partition A 310 is split in half by Y selectors 309, 312. The splitting of partition A 310 is for layout purposes, such that a first part of partition A 310 is aligned with partition B, while the other part of partition A 305 is aligned with partition C. For one embodiment, the splitting of partition A 310 optimizes performance for read speed. The Y selectors 309 and 312 are coupled to Y decoder 325. Additionally, a status register 335 is associated with partition A. The status register 335 indicates the status of partition A—idle, being written to, being read from, or being erased. Similarly, for partition B, there is an X decoder 317, Y select 319, and a status register 340. Partition C also includes an X decoder 323, a Y select 322, and a status register 345. For one embodiment, a single user interface 330 is coupled to the status registers 335, 340, 345 for each of the partitions.

Sense amplifiers 350 support all of the partitions. For one embodiment, the number of sense amplifiers is eighteen. Sixteen sense amplifiers 350 are used for a read operation to one of the partitions. One sense amplifier is used for a parallel write operation from one of the partitions. The interface includes a number of state machines used to control each of the parallel write operations. Thus, if there can be two parallel write operations (writing to two partitions simultaneously), there are two state machines.

The number of charge pumps 360 also parallels the number of parallel operations. For another embodiment, the number of connections to a single charge pump 360 equals the number of parallel operations. Each of these connections may be held at a different voltage level, permitting multiple operations using different voltage levels. For one embodiment, a separate connection is coupled to the decoders associated with each partition. Thus, a first connection is coupled to a first partition, a second connection is coupled to a second partition, and so on. Thus, each connection outputs a variety of voltage levels, corresponding to each of the operations that may be executed on the partition. For another embodiment, a first connection outputs a first voltage level for writing, a second connection outputs a second voltage level for reading, and a third connection outputs a third voltage level for erasing. In this instance, switches couple the appropriate partition to the appropriate connection for the operation about to be performed.

Figure 4:
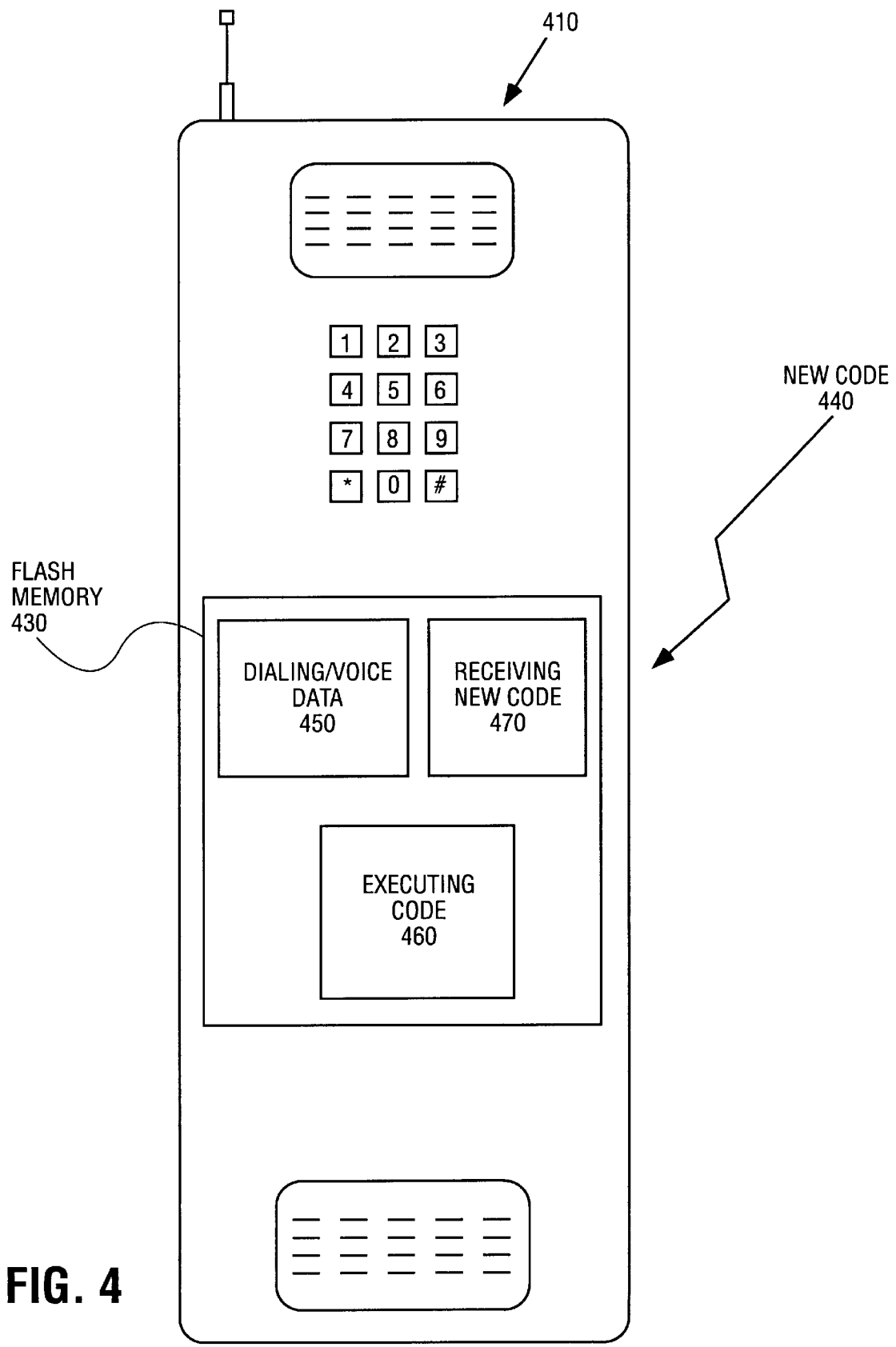
FIG. 4 illustrates an example of a cellular telephone using a flash memory device.

FIG. 4 illustrates an example of a cellular telephone using a flash memory device. The cellular telephone 410 includes a flash memory device 430. Although the flash memory device 430 is illustrated on the cellular phone 410, it is understood that generally the flash memory device 430 is received in a receptacle within the body of the cellular telephone 410.

The cellular phone 410 illustrated is active. That is, it is executing code. The partition 460 that includes the currently active code is being executed. The use of such code is known in the art. Another partition 450 includes dialing or voice data. For example, the cell phone 410 may include a dialing director, or similar data in the data partition 450. A third partition 470 is receiving new code 440 from outside. For one embodiment, the third partition may be updated remotely. Thus, while the cellular telephone is active, the code in the code partition 460 may be executed, while simultaneously new code 440 is written to the new code partition 470, and the data partition 450 is used to recall dialing data. In this way, the cellular telephone permits seamless updating of its code, and concurrent updating and use of the cellular telephone. Other applications of such seamless code updating may be similarly implemented.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. The present invention should not be construed as limited by such embodiments and examples, but rather construed according to the following claims.

What is claimed is:

1. A flash memory device comprising:
   a plurality of partitions, a number of partitions able to be written, read, or erased simultaneously;
   a charge pump providing a plurality of voltage outputs, each voltage output for outputting a voltage for reading, writing and erasing; and
   a plurality of sense amplifiers, the plurality of sense amplifiers comprising a first plurality of sense amplifiers for each simultaneously executable read operation and at least one sense amplifier for each simultaneously executable erase and write operation, a number of sense amplifiers used for a read operation differing from the number of sense amplifiers used for a write operation and an erase operation.

2. The flash memory device of claim 1, further comprising:
   a plurality of x decoders, each x decoder associated with a partition; and
   a plurality of y decoders, each y decoder associated with a partition.

3. The flash memory device of claim 1, further comprising a plurality of sense amplifiers.

4. The flash memory device of claim 1, wherein the first plurality of sense amplifier comprises a plurality of sense amplifiers for each parallel read operation.

5. The flash memory device of claim 1, wherein the charge pump comprises a plurality of charge pumps equal to the number of partitions able to be read, written, and erased simultaneously.

6. The flash memory device of claim 1, wherein the charge pump comprises a plurality of charge pumps equal to the plurality of partitions, such that each partition has a charge pump coupled to the partition to provide voltage levels.

7. The flash memory device of claim 1, wherein the plurality of voltage outputs corresponds in number to the plurality of partitions of the flash memory device, thereby providing a voltage output for each partition.

8. The flash memory device of claim 1, further comprising a plurality of status registers.

9. The flash memory device of claim 8, wherein the plurality of status registers corresponds to the plurality of partitions of the flash memory device.

10. A system comprising:
    a bus;
    a processor coupled to the bus;
    a memory coupled to the bus and accessible by the processor, the memory including a flash memory, the flash memory comprising a plurality of partitions, each of the partitions separately readable, writable, and erasable; and
    a plurality of sense amplifiers, such that there are enough sense amplifiers for each simultaneously executable operation, the plurality of sense amplifiers comprising a first plurality of sense amplifiers for each simultaneously executable read operation and at least one sense amplifier for each simultaneously executable erase and write operation.

11. The flash memory device of claim 10, further comprising:
    a plurality of x decoders, each of the x decoders associated with a partition;
    a plurality of y decoders, each of the y decoders associated with a partition.

12. The flash memory device of claim 10, wherein a number of sense amplifiers used for a read operation differ from the number of sense amplifiers used for a write operation and an erase operation.

13. The flash memory device of claim 10, wherein the first plurality of sense amplifier comprises sixteen sense amplifiers for each parallel read operation.

14. The flash memory device of claim 10, further comprising a charge pump for providing a voltage output.

15. The flash memory device of claim 14, wherein the charge pump provides a plurality of voltage outputs.

16. The flash memory device of claim 15, wherein the plurality of voltage outputs corresponds in number to the plurality of partitions of the flash memory device, thereby providing a voltage output for each partition.

17. The flash memory device of claim 10, further comprising a plurality of status registers.

18. The flash memory device of claim 17, wherein the plurality of status registers corresponds to the plurality of partitions of the flash memory device.

19. A method of simultaneously accessing and erasing a flash memory, the flash memory including a first partition, a second partition, and a third partition, the method comprising:
    accessing the first partition or the second partition using a first plurality of sense amplifiers; and
    simultaneously erasing the third partition using one sense amplifier.

20. The method of claim 19, wherein said step of accessing comprises reading from or writing to the first partition or the second partition.

21. The method of claim 19, wherein said step of erasing comprises the step of:
    applying a first voltage level to the third partition.

22. The method of claim 21, wherein said step of accessing comprises the step of:
    applying a second voltage level to the first or the second partition.

23. The method of claim 22, wherein said second voltage level is higher than said first voltage level.

* * * * *